United States Patent
Kosowsky et al.

(10) Patent No.: US 9,320,135 B2
(45) Date of Patent: *Apr. 19, 2016

(54) ELECTRIC DISCHARGE PROTECTION FOR SURFACE MOUNTED AND EMBEDDED COMPONENTS

(75) Inventors: Lex Kosowsky, San Jose, CA (US); Robert Fleming, San Jose, CA (US); Bhret Graydon, San Jose, CA (US); Daniel Vasquez, San Jose, CA (US)

(73) Assignee: LITTELFUSE, INC., Chicago, IL (US)

( * ) Notice: Subject to any disclaimer, the term of this patent is extended or adjusted under 35 U.S.C. 154(b) by 152 days.

This patent is subject to a terminal disclaimer.

(21) Appl. No.: 13/035,791

(22) Filed: Feb. 25, 2011

(65) Prior Publication Data

US 2011/0211319 A1 Sep. 1, 2011

Related U.S. Application Data

(60) Provisional application No. 61/308,825, filed on Feb. 26, 2010.

(51) Int. Cl.
*H05K 1/18* (2006.01)
*H05K 1/02* (2006.01)

(52) U.S. Cl.
CPC ............ *H05K 1/0254* (2013.01); *H05K 1/0259* (2013.01); *H05K 1/181* (2013.01); *H05K 2201/0738* (2013.01); *H05K 2203/304* (2013.01)

(58) Field of Classification Search
CPC ... H05K 1/0254; H05K 1/0259; H05K 1/181; H05K 2201/0738; H05K 2203/304
USPC ......... 174/250–268; 361/56, 191.1, 111, 127, 361/760–764
See application file for complete search history.

(56) References Cited

U.S. PATENT DOCUMENTS

| | | | |
|---|---|---|---|
| 3,347,724 A | 10/1967 | Schneble, Jr. et al. |
| 3,685,026 A | 8/1972 | Wakabayashi et al. |
| 3,685,028 A | 8/1972 | Wakabayashi et al. |
| 3,723,635 A | 3/1973 | Smith |
| 3,808,576 A | 4/1974 | Castonguay et al. |
| 3,926,916 A | 12/1975 | Mastrangelo |
| 3,977,957 A | 8/1976 | Kosowsky et al. |

(Continued)

FOREIGN PATENT DOCUMENTS

| | | |
|---|---|---|
| CH | 663491 A5 | 12/1987 |
| DE | 3040784 A1 | 5/1982 |

(Continued)

OTHER PUBLICATIONS

Breton et al., "Mechanical properties of multiwall carbon nanotubes/epoxy composites: influence of network morphology," Carbon Elsevier UK, vol. 42, No. 5-6, pp. 1027-1030 (2004).

(Continued)

*Primary Examiner* — Yuriy Semenenko
(74) *Attorney, Agent, or Firm* — Kacvinsky Daisak Bluni PLLC

(57) ABSTRACT

Printed circuit boards including voltage switchable dielectric materials (VSDM) are disclosed. The VSDMs are used to protect electronic components, arranged on or embedded in printed circuit boards, against electric discharges, such as electrostatic discharges or electric overstresses. During an overvoltage event, a VSDM layer shunts excess currents to ground, thereby preventing electronic components from destruction or damage.

14 Claims, 9 Drawing Sheets

(56) References Cited

U.S. PATENT DOCUMENTS

| | | | |
|---|---|---|---|
| 4,113,899 | A | 9/1978 | Henry et al. |
| 4,133,735 | A | 1/1979 | Afromowitz et al. |
| 4,252,692 | A | 2/1981 | Taylor et al. |
| 4,269,672 | A | 5/1981 | Inoue |
| 4,331,948 | A | 5/1982 | Malinaric et al. |
| 4,359,414 | A | 11/1982 | Mastrangelo |
| 4,405,432 | A | 9/1983 | Kosowsky |
| 4,439,809 | A | 3/1984 | Weight et al. |
| 4,506,285 | A | 3/1985 | Einzinger et al. |
| 4,591,411 | A | 5/1986 | Reimann |
| 4,642,160 | A | 2/1987 | Burgess |
| 4,702,860 | A | 10/1987 | Kinderov et al. |
| 4,714,952 | A | 12/1987 | Takekawa et al. |
| 4,726,877 | A | 2/1988 | Fryd et al. |
| 4,726,991 | A | 2/1988 | Hyatt et al. |
| 4,799,128 | A | 1/1989 | Chen |
| 4,888,574 | A | 12/1989 | Rice et al. |
| 4,892,776 | A | 1/1990 | Rice |
| 4,918,033 | A | 4/1990 | Bartha et al. |
| 4,928,199 | A | 5/1990 | Diaz et al. |
| 4,935,584 | A | 6/1990 | Boggs |
| 4,977,357 | A | 12/1990 | Shrier |
| 4,992,333 | A | 2/1991 | Hyatt |
| 4,996,945 | A | 3/1991 | Dix, Jr. |
| 5,068,634 | A | 11/1991 | Shrier |
| 5,092,032 | A | 3/1992 | Murakami |
| 5,095,626 | A | 3/1992 | Kitamura et al. |
| 5,099,380 | A | 3/1992 | Childers et al. |
| 5,142,263 | A | 8/1992 | Childers et al. |
| 5,148,355 | A | 9/1992 | Lowe et al. |
| 5,167,778 | A | 12/1992 | Kaneko et al. |
| 5,183,698 | A | 2/1993 | Stephenson et al. |
| 5,189,387 | A | 2/1993 | Childers et al. |
| 5,246,388 | A | 9/1993 | Collins et al. |
| 5,248,517 | A | 9/1993 | Shrier et al. |
| 5,252,195 | A | 10/1993 | Kobayashi et al. |
| 5,260,848 | A | 11/1993 | Childers |
| 5,262,754 | A | 11/1993 | Collins |
| 5,278,535 | A | 1/1994 | Xu et al. |
| 5,282,312 | A | 2/1994 | DiStefano et al. |
| 5,294,374 | A | 3/1994 | Martinez et al. |
| 5,295,297 | A | 3/1994 | Kitamura et al. |
| 5,300,208 | A | 4/1994 | Angelopoulos et al. |
| 5,317,801 | A | 6/1994 | Tanaka et al. |
| 5,340,641 | A | 8/1994 | Xu |
| 5,347,258 | A | 9/1994 | Howard et al. |
| 5,354,712 | A | 10/1994 | Ho et al. |
| 5,367,764 | A | 11/1994 | DiStefano et al. |
| 5,378,858 | A | 1/1995 | Bruckner et al. |
| 5,380,679 | A | 1/1995 | Kano |
| 5,393,597 | A | 2/1995 | Childers et al. |
| 5,403,208 | A | 4/1995 | Felcman et al. |
| 5,404,637 | A | 4/1995 | Kawakami |
| 5,413,694 | A | 5/1995 | Dixon et al. |
| 5,416,662 | A | 5/1995 | Kurasawa et al. |
| 5,440,075 | A | 8/1995 | Kawakita et al. |
| 5,444,593 | A | 8/1995 | Allina |
| 5,476,471 | A | 12/1995 | Shifrin et al. |
| 5,481,795 | A | 1/1996 | Hatakeyama et al. |
| 5,483,407 | A | 1/1996 | Anastasio et al. |
| 5,487,218 | A | 1/1996 | Bhatt et al. |
| 5,493,146 | A | 2/1996 | Pramanik et al. |
| 5,501,350 | A | 3/1996 | Yoshida et al. |
| 5,502,889 | A | 4/1996 | Casson et al. |
| 5,510,629 | A | 4/1996 | Karpovich et al. |
| 5,550,400 | A | 8/1996 | Takagi et al. |
| 5,557,136 | A | 9/1996 | Gordon et al. |
| 5,654,564 | A | 8/1997 | Mohsen |
| 5,669,381 | A | 9/1997 | Hyatt |
| 5,685,070 | A | 11/1997 | Alpaugh et al. |
| 5,708,298 | A | 1/1998 | Masayuki et al. |
| 5,714,794 | A | 2/1998 | Tsuyama et al. |
| 5,734,188 | A | 3/1998 | Murata et al. |
| 5,744,759 | A | 4/1998 | Ameen et al. |
| 5,781,395 | A | 7/1998 | Hyatt |
| 5,802,714 | A | 9/1998 | Kobayashi et al. |
| 5,807,509 | A | 9/1998 | Shrier et al. |
| 5,808,351 | A | 9/1998 | Nathan et al. |
| 5,834,160 | A | 11/1998 | Ferry et al. |
| 5,834,824 | A | 11/1998 | Shepherd et al. |
| 5,834,893 | A | 11/1998 | Bulovic et al. |
| 5,848,467 | A | 12/1998 | Khandros et al. |
| 5,856,910 | A | 1/1999 | Yurchenco et al. |
| 5,865,934 | A | 2/1999 | Yamamoto et al. |
| 5,869,869 | A | 2/1999 | Hively |
| 5,874,902 | A | 2/1999 | Heinrich et al. |
| 5,906,042 | A | 5/1999 | Lan et al. |
| 5,910,685 | A | 6/1999 | Watanabe et al. |
| 5,926,951 | A | 7/1999 | Khandros et al. |
| 5,940,683 | A | 8/1999 | Holm et al. |
| 5,946,555 | A | 8/1999 | Crumly et al. |
| 5,955,762 | A | 9/1999 | Hively |
| 5,956,612 | A | 9/1999 | Elliott et al. |
| 5,962,815 | A | 10/1999 | Lan et al. |
| 5,970,321 | A | 10/1999 | Hively |
| 5,972,192 | A | 10/1999 | Dubin et al. |
| 5,977,489 | A | 11/1999 | Crotzer et al. |
| 6,013,358 | A | 1/2000 | Winnett et al. |
| 6,023,028 | A | 2/2000 | Neuhalfen |
| 6,064,094 | A | 5/2000 | Intrater et al. |
| 6,108,184 | A | 8/2000 | Minervini et al. |
| 6,114,672 | A | 9/2000 | Iwasaki |
| 6,130,459 | A | 10/2000 | Intrater |
| 6,160,695 | A | 12/2000 | Winnett et al. |
| 6,172,590 | B1 | 1/2001 | Shrier et al. |
| 6,184,280 | B1 | 2/2001 | Shituba |
| 6,191,928 | B1 | 2/2001 | Rector et al. |
| 6,198,392 | B1 | 3/2001 | Hahn et al. |
| 6,211,554 | B1 | 4/2001 | Whitney et al. |
| 6,239,687 | B1 | 5/2001 | Shrier et al. |
| 6,251,513 | B1 | 6/2001 | Rector et al. |
| 6,310,752 | B1 | 10/2001 | Shrier et al. |
| 6,316,734 | B1 | 11/2001 | Yang |
| 6,340,789 | B1 | 1/2002 | Petritsch et al. |
| 6,351,011 | B1 | 2/2002 | Whitney et al. |
| 6,373,719 | B1 | 4/2002 | Behling et al. |
| 6,407,411 | B1 | 6/2002 | Wojnarowski |
| 6,433,394 | B1 | 8/2002 | Intrater |
| 6,448,900 | B1 | 9/2002 | Chen |
| 6,455,916 | B1 | 9/2002 | Robinson |
| 6,468,593 | B1 | 10/2002 | Iazawa |
| 6,512,458 | B1 | 1/2003 | Kobayashi et al. |
| 6,534,422 | B1 | 3/2003 | Ichikawa et al. |
| 6,542,065 | B2 | 4/2003 | Shrier et al. |
| 6,549,114 | B2 | 4/2003 | Whitney et al. |
| 6,570,765 | B2 | 5/2003 | Behling et al. |
| 6,593,597 | B2 | 7/2003 | Sheu |
| 6,621,172 | B2 | 9/2003 | Nakayama et al. |
| 6,628,498 | B2 | 9/2003 | Whitney et al. |
| 6,642,297 | B1 | 11/2003 | Hyatt et al. |
| 6,657,532 | B1 | 12/2003 | Shrier et al. |
| 6,677,183 | B2 | 1/2004 | Sakaguchi et al. |
| 6,693,508 | B2 * | 2/2004 | Whitney et al. ............ 338/20 |
| 6,709,944 | B1 | 3/2004 | Durocher et al. |
| 6,741,217 | B2 | 5/2004 | Toncich et al. |
| 6,797,145 | B2 | 9/2004 | Kosowsky |
| 6,882,051 | B2 | 4/2005 | Majumdar et al. |
| 6,903,175 | B2 | 6/2005 | Gore et al. |
| 6,911,676 | B2 | 6/2005 | Yoo |
| 6,916,872 | B2 | 7/2005 | Yadav et al. |
| 6,981,319 | B2 | 1/2006 | Shrier |
| 7,034,652 | B2 | 4/2006 | Whitney et al. |
| 7,049,926 | B2 | 5/2006 | Shrier et al. |
| 7,053,468 | B2 | 5/2006 | Lee |
| 7,064,353 | B2 | 6/2006 | Bhat |
| 7,067,840 | B2 | 6/2006 | Klauk |
| 7,132,697 | B2 | 11/2006 | Weimer et al. |
| 7,132,922 | B2 | 11/2006 | Harris et al. |
| 7,141,184 | B2 | 11/2006 | Chacko et al. |
| 7,173,288 | B2 | 2/2007 | Lee et al. |
| 7,183,891 | B2 | 2/2007 | Harris et al. |
| 7,202,770 | B2 | 4/2007 | Harris et al. |
| 7,205,613 | B2 | 4/2007 | Fjelstand et al. |
| 7,218,492 | B2 | 5/2007 | Shrier |

(56) References Cited

U.S. PATENT DOCUMENTS

| | | | |
|---|---|---|---|
| 7,279,724 B2 | 10/2007 | Collins et al. | |
| 7,320,762 B2 | 1/2008 | Greuter et al. | |
| 7,341,824 B2 | 3/2008 | Sexton | |
| 7,417,194 B2 | 8/2008 | Shrier | |
| 7,446,030 B2 | 11/2008 | Kosowsky | |
| 7,488,625 B2 | 2/2009 | Knall | |
| 7,492,504 B2 | 2/2009 | Chopra et al. | |
| 7,528,467 B2 | 5/2009 | Lee | |
| 7,535,462 B2 | 5/2009 | Spath et al. | |
| 7,585,434 B2 | 9/2009 | Morita | |
| 7,593,203 B2 * | 9/2009 | Dudnikov et al. | 361/56 |
| 7,609,141 B2 | 10/2009 | Harris et al. | |
| 7,692,270 B2 | 4/2010 | Subramanyam et al. | |
| 7,872,251 B2 | 1/2011 | Kosowsky et al. | |
| 7,923,844 B2 | 4/2011 | Kosowsky | |
| 8,045,312 B2 | 10/2011 | Shrier | |
| 2002/0004258 A1 | 1/2002 | Nakayama et al. | |
| 2002/0050912 A1 | 5/2002 | Shrier et al. | |
| 2002/0061363 A1 | 5/2002 | Halas et al. | |
| 2003/0010960 A1 | 1/2003 | Greuter et al. | |
| 2003/0025587 A1 | 2/2003 | Whitney et al. | |
| 2003/0071245 A1 | 4/2003 | Harris, VI | |
| 2003/0079910 A1 | 5/2003 | Kosowsky | |
| 2003/0151029 A1 | 8/2003 | Hsu | |
| 2003/0218851 A1 | 11/2003 | Harris et al. | |
| 2004/0000725 A1 | 1/2004 | Lee | |
| 2004/0062041 A1 | 4/2004 | Cross et al. | |
| 2004/0063839 A1 | 4/2004 | Kawate et al. | |
| 2004/0095658 A1 | 5/2004 | Buretea et al. | |
| 2004/0154828 A1 | 8/2004 | Moller et al. | |
| 2004/0160300 A1 | 8/2004 | Shrier | |
| 2004/0201941 A1 | 10/2004 | Harris et al. | |
| 2004/0211942 A1 | 10/2004 | Clark et al. | |
| 2004/0241894 A1 | 12/2004 | Nagai et al. | |
| 2004/0262583 A1 | 12/2004 | Lee et al. | |
| 2005/0026334 A1 | 2/2005 | Knall | |
| 2005/0039949 A1 | 2/2005 | Kosowsky | |
| 2005/0057867 A1 | 3/2005 | Harris et al. | |
| 2005/0083163 A1 | 4/2005 | Shrier | |
| 2005/0106098 A1 | 5/2005 | Tsang et al. | |
| 2005/0121653 A1 | 6/2005 | Chacko | |
| 2005/0175938 A1 | 8/2005 | Casper et al. | |
| 2005/0184387 A1 | 8/2005 | Collins et al. | |
| 2005/0218380 A1 | 10/2005 | Gramespacher et al. | |
| 2005/0255631 A1 | 11/2005 | Bureau et al. | |
| 2005/0274455 A1 | 12/2005 | Extrand | |
| 2005/0274956 A1 | 12/2005 | Bhat | |
| 2005/0275070 A1 | 12/2005 | Hollingsworth | |
| 2006/0060880 A1 | 3/2006 | Lee et al. | |
| 2006/0069199 A1 | 3/2006 | Charati et al. | |
| 2006/0142455 A1 | 6/2006 | Agarwal | |
| 2006/0152334 A1 | 7/2006 | Maercklein et al. | |
| 2006/0166474 A1 | 7/2006 | Vereecken et al. | |
| 2006/0167139 A1 | 7/2006 | Nelson et al. | |
| 2006/0181826 A1 | 8/2006 | Dudnikov, Jr. et al. | |
| 2006/0181827 A1 | 8/2006 | Dudnikov, Jr. et al. | |
| 2006/0193093 A1 | 8/2006 | Bertin | |
| 2006/0199390 A1 | 9/2006 | Dudnikov, Jr. et al. | |
| 2006/0211837 A1 | 9/2006 | Ko et al. | |
| 2006/0214156 A1 | 9/2006 | Pan et al. | |
| 2006/0234127 A1 | 10/2006 | Kim | |
| 2006/0291127 A1 | 12/2006 | Kim et al. | |
| 2007/0114640 A1 | 5/2007 | Kosowsky | |
| 2007/0116976 A1 | 5/2007 | Tan et al. | |
| 2007/0123625 A1 | 5/2007 | Dorade et al. | |
| 2007/0126018 A1 * | 6/2007 | Kosowsky | 257/98 |
| 2007/0139848 A1 * | 6/2007 | Harris et al. | 361/118 |
| 2007/0146941 A1 | 6/2007 | Harris et al. | |
| 2007/0208243 A1 | 9/2007 | Gabriel et al. | |
| 2007/0241458 A1 | 10/2007 | Ding et al. | |
| 2008/0045770 A1 | 2/2008 | Sigmund et al. | |
| 2008/0047930 A1 | 2/2008 | Blanchet et al. | |
| 2008/0073114 A1 | 3/2008 | Kosowsky et al. | |
| 2008/0144355 A1 | 6/2008 | Boeve et al. | |
| 2008/0223603 A1 * | 9/2008 | Kim et al. | 174/255 |
| 2008/0278873 A1 * | 11/2008 | Leduc et al. | 361/56 |
| 2008/0313576 A1 * | 12/2008 | Kosowsky et al. | 716/2 |
| 2009/0044970 A1 | 2/2009 | Kosowsky | |
| 2009/0309074 A1 | 12/2009 | Chen et al. | |
| 2009/0310265 A1 | 12/2009 | Fukuoka et al. | |
| 2010/0038119 A1 | 2/2010 | Kosowsky | |
| 2010/0038121 A1 | 2/2010 | Kosowsky | |
| 2010/0040896 A1 | 2/2010 | Kosowsky | |
| 2010/0044079 A1 | 2/2010 | Kosowsky | |
| 2010/0044080 A1 | 2/2010 | Kosowsky | |
| 2010/0047535 A1 | 2/2010 | Kosowsky et al. | |
| 2010/0187006 A1 | 7/2010 | Kosowsky et al. | |
| 2010/0243302 A1 | 9/2010 | Kosowsky et al. | |
| 2010/0270588 A1 | 10/2010 | Kosowsky et al. | |
| 2011/0061230 A1 | 3/2011 | Kosowsky | |
| 2011/0062388 A1 | 3/2011 | Kosowsky et al. | |
| 2011/0211289 A1 * | 9/2011 | Kosowsky et al. | 361/91.1 |
| 2011/0317318 A1 | 12/2011 | Fleming et al. | |

FOREIGN PATENT DOCUMENTS

| | | |
|---|---|---|
| DE | 10115333 A1 | 1/2002 |
| DE | 102004049053 | 5/2005 |
| DE | 102006047377 | 4/2008 |
| EP | 0790758 A1 | 8/1997 |
| EP | 0930623 A1 | 7/1999 |
| EP | 1003229 A1 | 5/2000 |
| EP | 1245586 A2 | 10/2002 |
| EP | 1542240 A2 | 6/2005 |
| EP | 1580809 A2 | 9/2005 |
| EP | 1990834 A2 | 11/2008 |
| JP | 56091464 A | 7/1981 |
| JP | 63 195275 A | 8/1988 |
| JP | 2000062076 A | 2/2000 |
| WO | WO8906859 A2 | 7/1989 |
| WO | WO9602922 A2 | 2/1996 |
| WO | WO9602924 A1 | 2/1996 |
| WO | WO9726665 A1 | 7/1997 |
| WO | WO9823018 A1 | 5/1998 |
| WO | WO9924992 A1 | 5/1999 |
| WO | WO02103085 A1 | 12/2002 |
| WO | WO2005100426 A1 | 10/2005 |
| WO | WO2006130366 A2 | 12/2006 |
| WO | WO2007062170 A2 | 5/2007 |
| WO | WO2007062171 A2 | 5/2007 |
| WO | WO2008016858 A1 | 2/2008 |
| WO | WO2008016859 A1 | 2/2008 |
| WO | WO2008153584 A1 | 12/2008 |

OTHER PUBLICATIONS

Celzard, A., et al., "Conduction Mechanisms in Some Graphite-polymer Composites: The Effect of a Direct-current Electric Field", Journal of Physics: Condensed Matter, 9 (1997) pp. 2225-2237.
Facchetti, Antonio, "Semiconductors for Organic Transistors", Materials Today, vol. 10, No. 3, pp. 28-37.
Fullerene Chemistry—Wikipedia, http://en.wikipedia.org/wiki/Fullerene/chemistry, 6 pages, printed Apr. 8, 2010.
Granstrom et al., "Laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
Levinson et al. "The Physics of Metal Oxide Varistors," J. App. Phys. 46 (3): 1332-1341 (1975).
Modine, F.A. and Hyatt, H.M. "New Varistor Material", Journal of Applied Physics, 64 (8), Oct. 15, 1988, pp. 4229-4232.
Onoda et al., "Photoinduced Charge Transfer of Conducting Polymer Compositions," IEICE Trans. Electronics, vol. E81-C(7), pp. 1051-1056 (1998).
Raffaelle et al., "Nanomaterial Development for Polymeric Solar Cells," IEEE 4th World Conf on Photovoltaic energy Conversion, pp. 186-189 (2006).
Reese, Colin and Bao, Zhenan, "Organic Single-Crystal Field-Effect Transistors", Materials Today, vol. 10, No. 3, pp. 20-27.
Saunders et al., "Nanoparticle-polymer photovoltaic cells," Adv. Colloid Int. Sci., vol. 138, No. 1, pp. 1-23 (2007).

* cited by examiner

ELECTRIC DISCHARGE PROTECTION FOR SURFACE MOUNTED AND EMBEDDED COMPONENTS

CROSS-REFERENCE TO RELATED APPLICATIONS

This nonprovisional patent application claims the priority benefit of U.S. provisional application No. 61/308,825 filed on Feb. 26, 2010, titled "Protecting Embedded Components," which is hereby incorporated by reference in its entirety.

BACKGROUND

1. Field of the Invention

This application relates generally to the protection of electronic devices against surge events, and more specifically to the application of voltage switchable dielectric materials for circuit boards to protect surface mounted and embedded electronic components thereof against electric discharge events.

2. Description of Related Art

Electric discharge, such as electrostatic discharge (ESD), and electrical overstress (EOS) are among the leading causes of failure in electronic components and devices. The continuing trend to miniaturize electronic devices and the integration of increasingly smaller-scaled components into circuits causes an increase in ESD susceptibility problems. Consequently, these failures commonly lead to performance reduction or destruction of electronic devices due to unwanted overvoltage and/or overcurrent influence.

Various solutions have become available to protect electronic devices from ESD and EOS effects. To address ESD issues, engineers commonly use different capacitor based arrangements, Zener diodes, transient voltage suppression (TVS) diodes, multilayer varistors, Schottky diodes, and so forth. However, the aforementioned devices need to be mounted on circuit boards and, therefore, require additional space, in addition to increasing the complexity of the design. Moreover, most integrated circuits cannot be completely protected with existing ESD solutions.

SUMMARY OF THE CLAIMED INVENTION

Various embodiments relate to the use of voltage switchable dielectric materials in printed circuit boards to provide techniques for shunting currents to ground in case of an overvoltage and/or overcurrent event, thereby preventing damage to electronic components In one embodiment, a printed circuit board is provided including at least one non-conductive layer, a conductor, a voltage switchable dielectric material (VSDM) applied to the conductor, and an electronic component having at least one lead, wherein the at least one lead is electrically coupled to the VSDM layer. The VSDM switches from being dielectric to being conductive when a voltage applied to the material exceeds a characteristic voltage level. The electronic component may be an embedded component or a surface mounted component. The electronic component may be a passive component such as a resistor, an inductor, or a capacitor. The electronic component may be an active component such as a diode, a transistor, a semiconductor device, a circuit, a chip, or an integrated circuit.

In another embodiment, a printed circuit board is provided including at least one non-conductive layer, a conductor, a voltage switchable dielectric material (VSDM) applied to the at least one non-conductive layer, and an electronic component having at least one lead, wherein the at least one lead is electrically coupled to the VSDM layer. The VSDM switches from being dielectric to being conductive when a voltage applied to the material exceeds a characteristic voltage level. The electronic component may be an embedded component or a surface mounted component. The electronic component may be a passive component such as a resistor, an inductor, or a capacitor. The electronic component may be an active component such as a diode, a transistor, a semiconductor device, a circuit, a chip, or an integrated circuit.

BRIEF DESCRIPTION OF THE DRAWINGS

Embodiments are illustrated by way of example and not limitation in the figures of the accompanying drawings, in which like references indicate similar elements.

DETAILED DESCRIPTION

Figure 1:
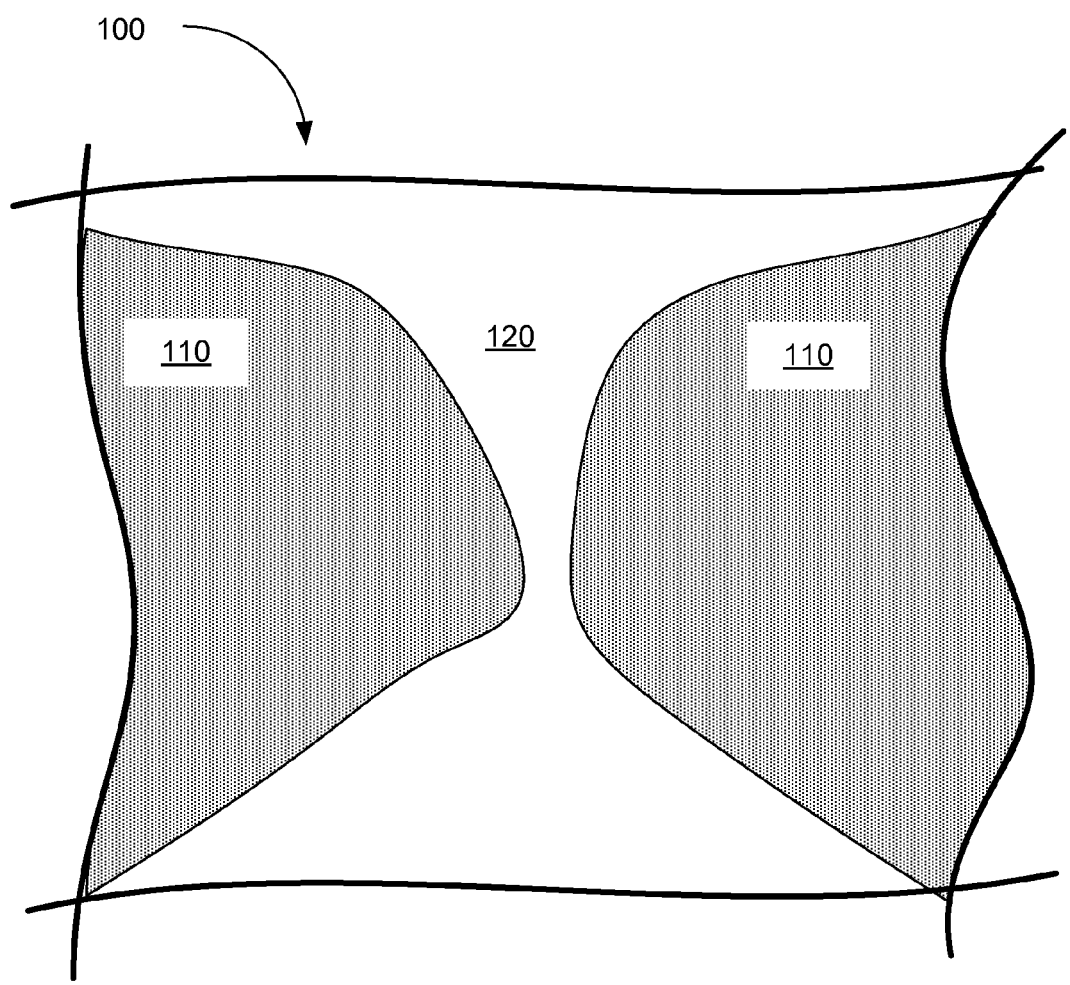
FIG. 1 illustrates an exemplary VSDM, according to an exemplary embodiment.

In some exemplary embodiments, protection against ESD or EOS may include using a VSDM. A VSDM may behave as an insulator at a lower voltage and a conductor at a higher voltage. A VSDM may have a specific switching voltage, which is a range between the states of low and high conductivity. The VSDM may provide a shunt to ground that protects a circuit and/or electronic component against voltage values above the switching voltage by allowing currents at the higher voltage values to pass to ground through the VSDM, rather than through the device or component being protected.

In this document, the terms "a" or "an" are used, as is common in patent documents, to include one or more than one. In this document, the term "or" is used to refer to a nonexclusive "or," such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

The word "exemplary" is used herein to mean "serving as an example, instance, or illustration." Any embodiment described herein as "exemplary" is not to be construed as preferred or advantageous over other embodiments. Likewise, the term "embodiments" does not require that all embodiments include the discussed feature, advantage or mode of operation.

As used herein, the term printed circuit board (PCB) relates to a printed wiring board, an etched wiring board or similar substrate. PCBs are used to mechanically support and electrically connect discrete electronic components using conductive leads, wires, lines, pathways, tracks or signal traces laminated or attached onto a non-conductive substrate. In some cases, metallic leads may be included (e.g., as a layer of Cu which is subsequently etched) to provide electrical connectivity among various attached electronic components. According to some embodiments disclosed herein, the PCB can be implemented as a single substrate or a multi-layer substrate having the same or different conductivity at different layers.

As used herein, the term electronic component may refer to a passive component and/or an active component, and includes but is not limited to a resistor, an inductor, a capacitor, a diode, a transistor, a semiconductor device, a circuit, a chip, an integrated circuit, or the like. Typically, electronic components have conductive leads used for electrical connection thereof to other components or pathways. According to embodiments disclosed herein, electronic components include surface mounted components and embedded components. Electronic components can be implemented as discrete elements or as thin films (e.g. a resistive layer, a capacitance layer, etc.) and deposited or sputtered on substrates or layers of PCB.

As used herein, VSDM relates to any composition, or combination of compositions that has a characteristic of being dielectric or non-conductive, unless a field or voltage that exceeds a specific value is applied to the material, in which case the material becomes conductive. Thus, the VSDM is a dielectric unless voltage (or field) exceeding the value associated with the material (e.g. such as provided by ESD or EOS events) is applied to the material, in which case the VSDM switches to a conductive state.

The VSDM may further be defined as a nonlinear resistance material. In many applications, the characteristic voltage of VSDM ranges in values that exceed the operational voltage levels of the circuit or device several times over. Such voltage levels may be of the order of transient conditions (e.g., produced by electric charges, such as electrostatic discharge), although embodiments may include use of planned electrical events. Furthermore, one or more embodiments provide a VSDM that behaves similarly to a non-conductive or dielectric material in the absence of the voltage exceeding the characteristic voltage.

According to embodiments disclosed herein, the VSDM is a polymer-based material and may include filled polymers. The filled polymers may include a mixture of insulator, conductor, and semiconductor materials. Examples of insulative materials include but are not limited to silicone polymers, epoxy, polyimide, polyethylene, polypropylene, polyphenylene oxide, polysulphone, solgel materials, creamers, silicone dioxide, aluminum oxide, zirconia oxide, and other metal oxide insulators. Examples of conductive materials include metals, such as copper, aluminum, nickel, stainless steel, or the like. Examples of semiconductive materials include both organic and inorganic semiconductors. Some inorganic semiconductors include silicon, silicon carbide, boron nitride, aluminum nitride, nickel oxide, zinc oxide, and zinc sulfide. Examples of organic semiconductors include poly-3-exylthiophene, pentacene, perylene, carbon nanotubes, fullerenes, or the like. A specific formulation and composition may be selected for mechanical and electrical properties well suited to the particular application of the VSDM.

Additionally, one or more embodiments disclosed herein incorporate a VSDM layer over a PCB. The VSDM layer may provide a shunt to ground that protects a circuit and/or electronic component against voltages above the switching voltage by allowing currents at these voltages to pass to ground through the VSDM layer, rather than through the circuit and/or electronic component being protected.

FIG. 1 illustrates an exemplary VSDM 100. The VSDM 100 may include a conductive phase 110 and an insulating and/or semiconducting phase 120. At low voltages, VSDM 100 may behave as an insulator. At voltages above a switching voltage (e.g., above a trigger voltage, above a clamp voltage, etc.), VSDM 100 may behave as a conductor. Typically, VSDM 100 may be connected to an electrical ground, and may shunt current to ground during the protection of a device.

Figure 2:
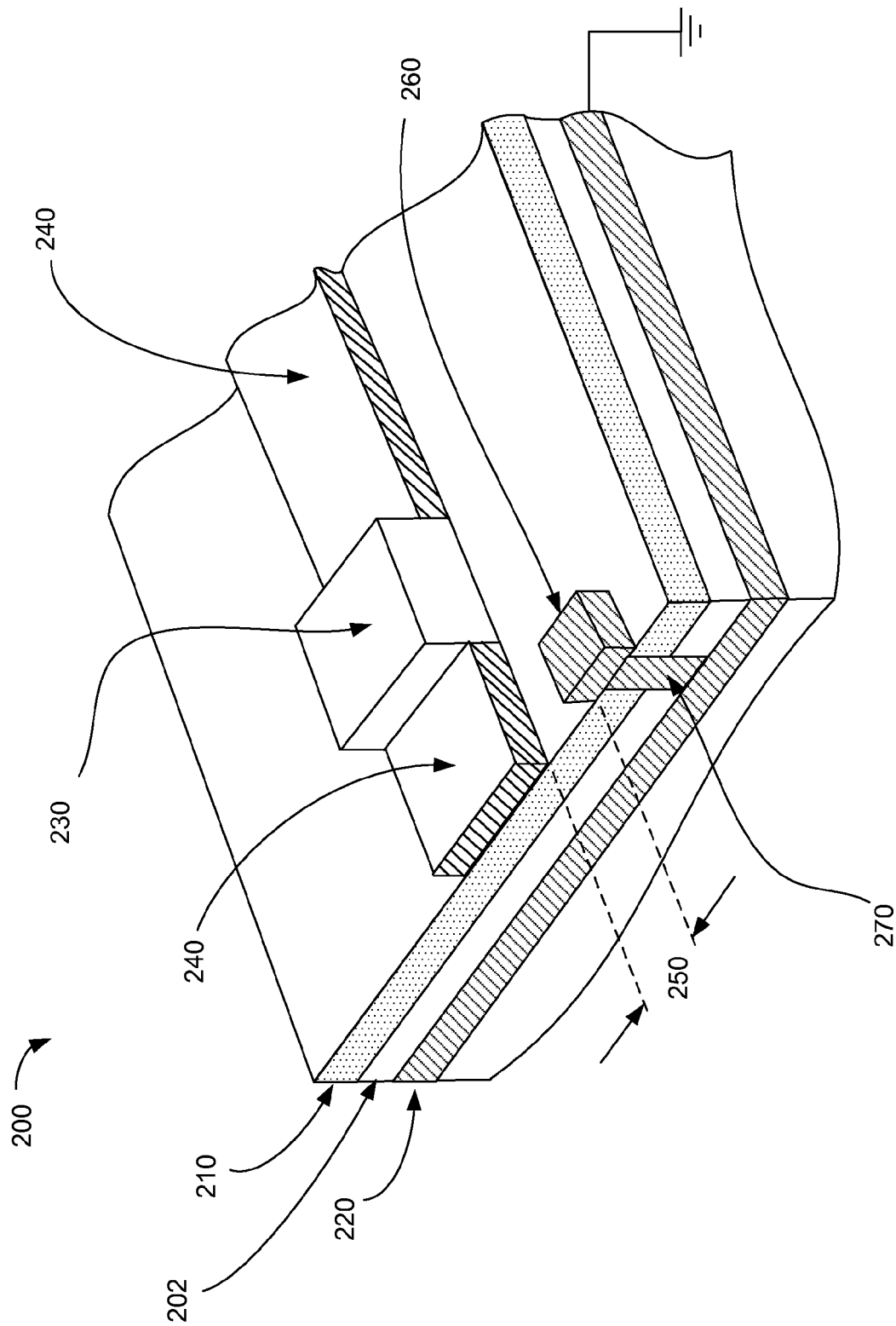
FIG. 2 illustrates a stackup incorporating a VSDM layer and a surface mounted electronic component, according to an exemplary embodiment.

FIG. 2 illustrates an exemplary stackup 200 incorporating a VSDM layer. The stackup 200 includes a non-conductive substrate 202 (e.g., a PCB and/or a layer thereof, such as a prepreg layer or the like). The stackup 200 also includes a VSDM layer 210, which may include any or all of a coating, a layer, a line, and a via. The VSDM may be of any shape, and may be connected to a conductor 220. Certain conductors 220 may be electrically connected to ground such that current is shunted through the VSDM layer to ground during an overvoltage event. The conductor may include a conductive layer, wire, pathline, via, connector, or the like.

An electronic component 230 that is to be protected (e.g., a resistor, inductor, capacitor, diode, transistor, circuit, chip, and the like) may be mounted on the VSDM layer 210. In some cases, the electronic component 230 may be a surface mounted device. According to another embodiment, the electronic component 230 may be a substantially planar device deposited directly on the VSDM layer 210 (e.g., as resistive ink). Furthermore, the electronic component 230 may include one or more leads 240 (e.g., Cu leads). During an overvoltage event (e.g., an ESD or EOS event) involving the electronic component 230, current may be shunted from the leads 240 (and/or the component 230) through the VSDM layer 210 to the conductor 220. The current may bridge a gap 250 between the component 230 and/or the lead 240 and a conductive pad 260, which may be electrically connected to the conductor 220 by a via 270.

The electronic component 230 may be characterized by one or more specifications such as a resistance, an inductance, a capacitance, or the like. In some cases, the ability to withstand an overvoltage and/or overcurrent event may not be specified. For example, a resistor may be designed to provide a resistance of 1 ohm during normal use (e.g., at voltages up to 10 volts) but may be damaged by higher voltages, and a similar resistor designed to be damage resistant may be too large in scale for a given application. Protecting a smaller resistor using a VSDM may allow the use of smaller components, which may be advantageous in packages such as PCB assemblies. While larger resistors such as 0603 and 0402 resistors may be large enough to withstand an overvoltage or overcurrent event, smaller resistors such as 0201 and 01005 resistors may require protection to maintain the integrity of the circuit.

Any of the VSDM layer 210, the conductor 220, and the electronic component 230 may be disposed on the surface of the substrate 202, or be inside (e.g., embedded in) the substrate 202. In some embodiments, the VSDM layer 210 and the electronic component 230 are embedded in a PCB (e.g., fabricated as layers in a PCB stackup). The stackup 200 may be embedded by adding and processing additional PCB components (e.g., additional layers of prepreg).

Figure 3:
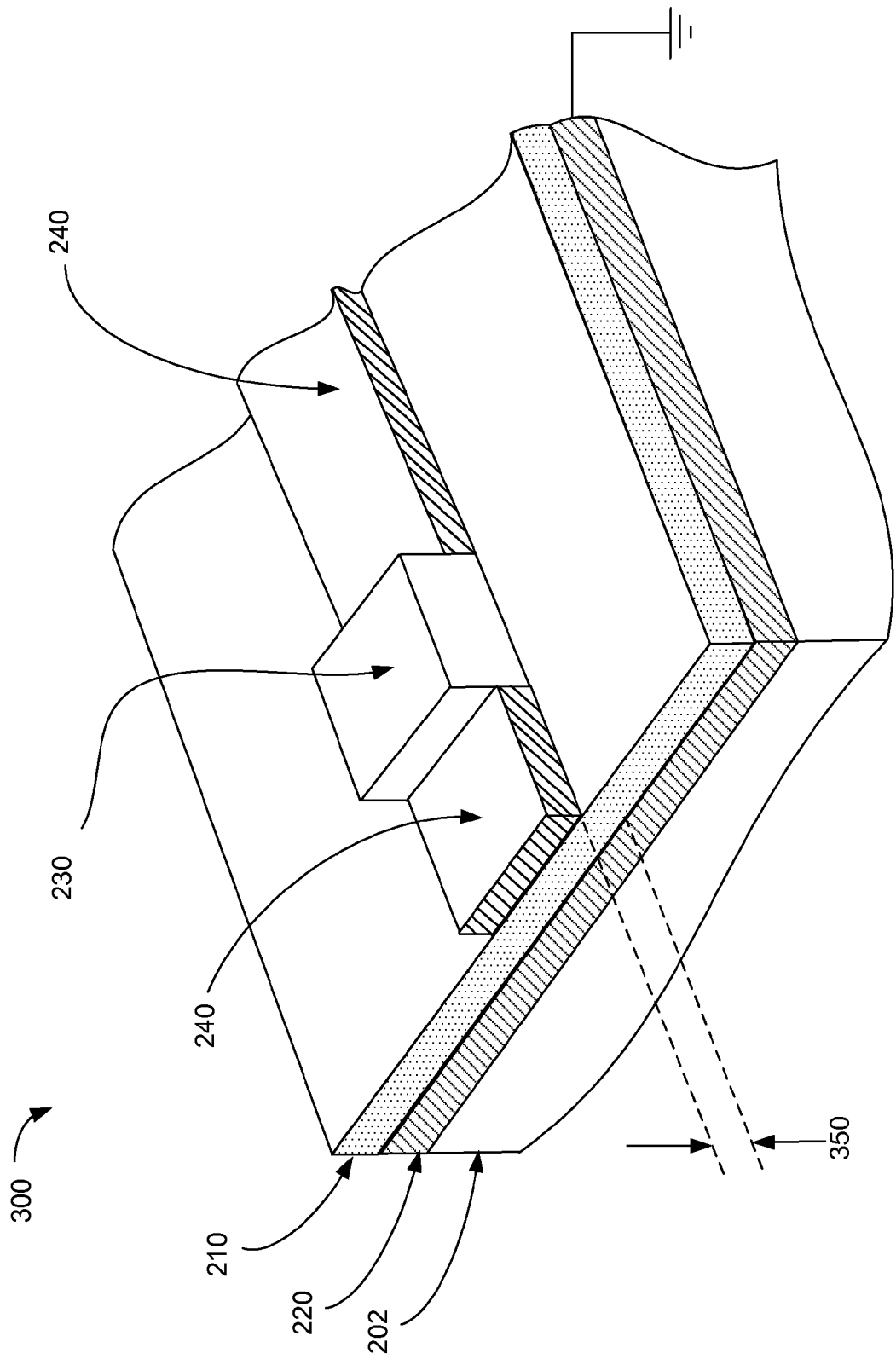
FIG. 3 illustrates a stackup incorporating a VSDM layer and a surface mounted electronic component, according to an exemplary embodiment.

FIG. 3 illustrates an exemplary stackup 300 incorporating a VSDM layer. In this example, the stackup 300 may include a non-conductive substrate 202 (such as a printed circuit board and/or a layer thereof) and/or other assembly. A VSDM layer 210 may include a coating, a layer, a line, a via, and/or be of any other shape, and may generally be connected to a conductor 220. An electronic component 230 being protected (surface mounted or embedded) may be mounted onto or incorporated into the VSDM layer 210. During an overvoltage event (e.g., an ESD event) involving the component 230, current may be shunted from the leads (and/or the component 230 itself) through the VSDM layer 210 to the conductor 220. In some cases, an active volume may be associated with the portion of the VSDM layer 210 located in a gap 350 between leads 240 and/or component 230 and conductor 220. An active volume may be associated with a thickness of the VSDM layer and an area (e.g., of bounding conductors), and may predominantly describe a volume through which current passes during an overvoltage event. The stackup 300 may be embedded by adding and processing additional PCB components (e.g., additional layers of prepreg, or the like).

Figure 4:
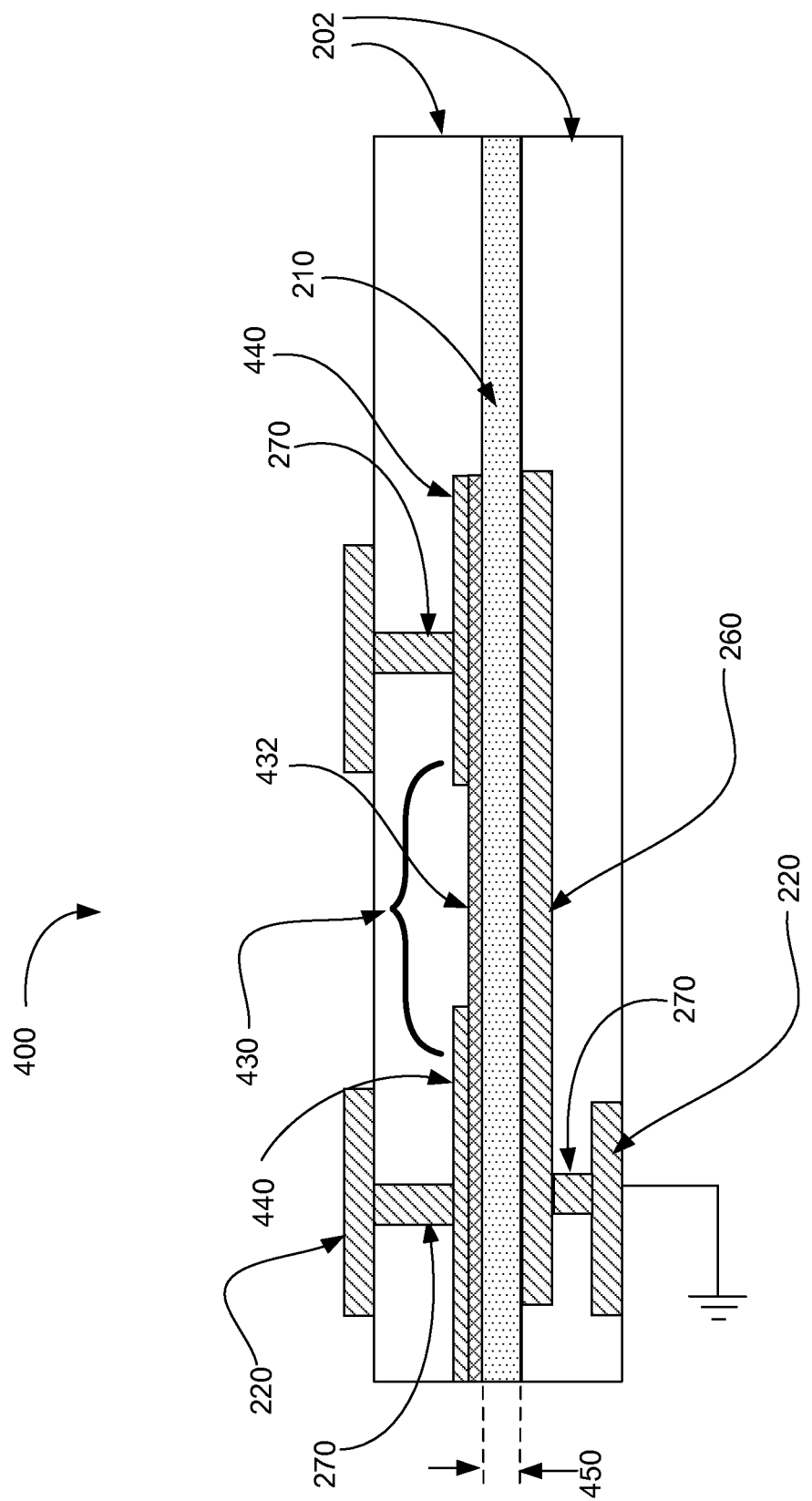
FIGS. 4-8 illustrate stackups incorporating VSDM layers and embedded electronic components, according to various exemplary embodiments.

FIG. 4 illustrates a cross section of an exemplary stackup 400. As shown, the stackup 400 may include one or more non-conductive substrates 202 and at least one VSDM layer 210. The VSDM layer 210 may be implemented as a coating, film, line, via, wire, pathline, and/or be of any other appropriate shape according to the specific application. The VSDM layer 210 may generally be connected to ground via one or more conductors 220, a pad 260, a via 270, or a combination thereof. An electronic component 430 (e.g., a thin film resistive layer 432 and associated leads 440) being protected may be deposited, sputtered, or otherwise formed onto the VSDM layer 210.

During an overvoltage event (e.g., an ESD or EOS event) involving the component 430, excess current may be shunted to ground, rather than passing through the component 430 at a level that damages the component 430. The current may be shunted by passing through the VSDM layer 210, which may include a gap 450. In some cases, additional layers (e.g., a film associated with the component 430) may be present in a condition that does not deleteriously affect the ESD/EOS protection capabilities of the VSDM layer 210 (e.g., a resistive film may be particularly thin, so the resistive layer 432 may be disposed beneath the leads 440 when the resistive layer 432 is particularly thin).

Figure 5:
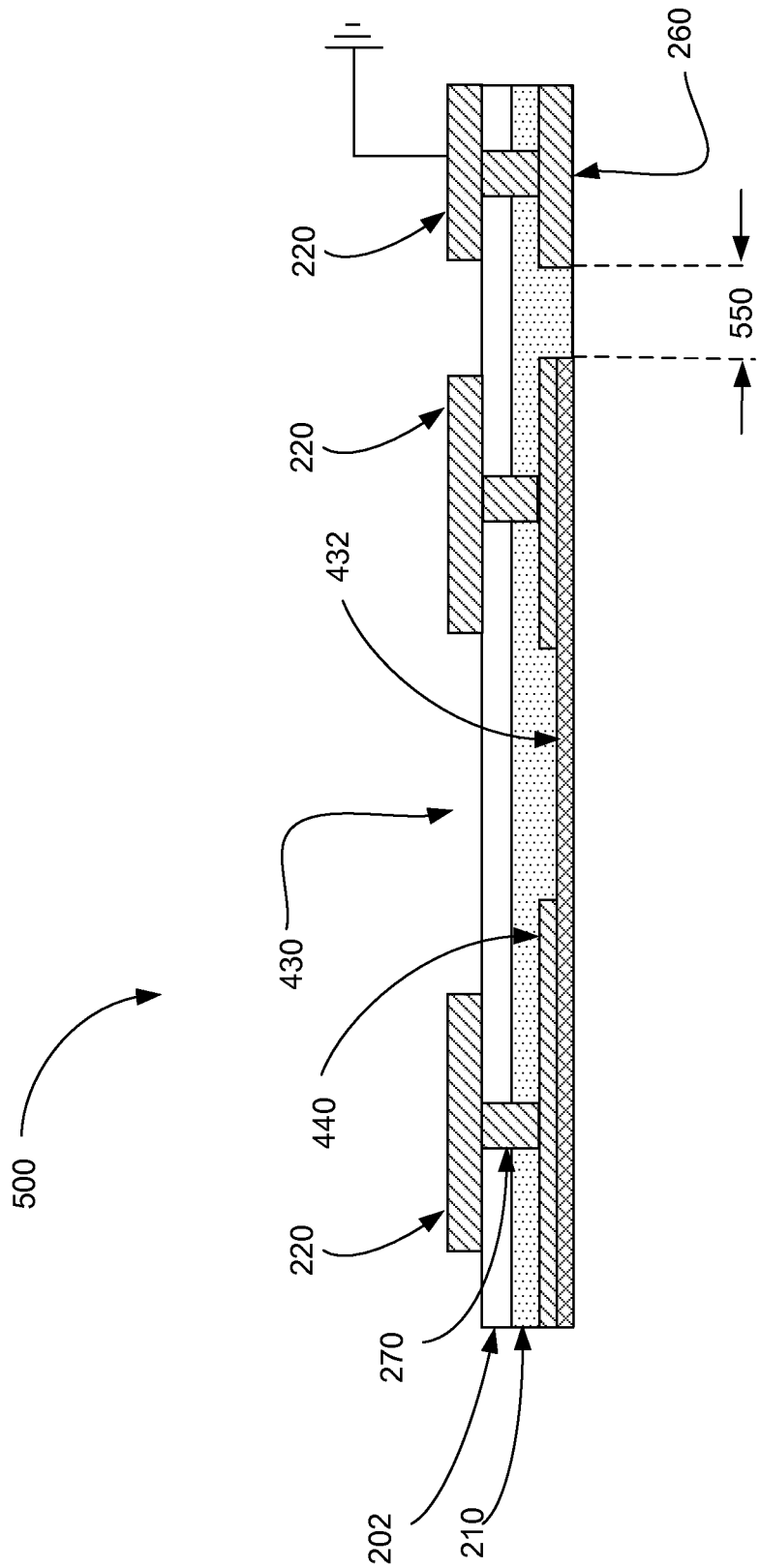

FIG. 5 illustrates a cross section of a stackup 500. In this example, the stackup 500 may include at least one non-conductive substrate 202 and a VSDM layer 210. The VSDM layer 210 may be implemented as a coating, film, line, via, wire, pathline, and/or be of any other appropriate shape according to the specific application. The VSDM layer 210 may generally be connected to ground via one or more conductors 220 disposed on the surface of the stackup 500, and also by means of a pad 260, a via 270, or a combination thereof. An electronic component 430 being protected may be deposited, sputtered or otherwise formed onto the VSDM layer 210. The electronic component 430 may be implemented as a thin film resistive layer 432 and include associated conductive leads 440, which may also be deposited or sputtered onto the resistive layer 432 and/or one of the stackup layers.

In case of an overvoltage event related to an ESD or EOS involving the component 430, overcurrent may be shunted to ground, rather than passing through the electronic component 430. The excess current may be shunted by passing through the VSDM layer 210, which may include a gap 550.

Figure 6:
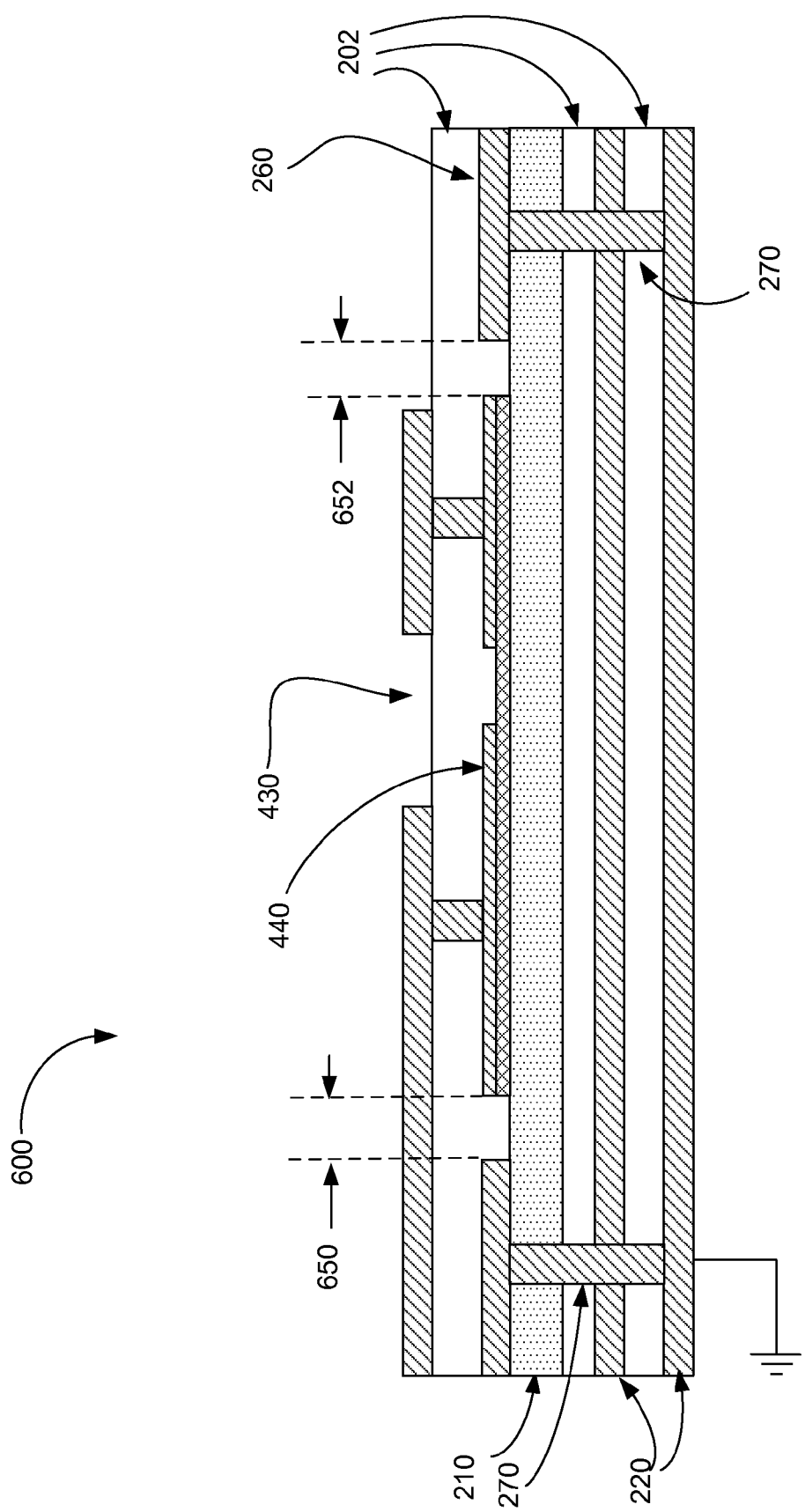

FIG. 6 illustrates a cross section of an exemplary stackup 600. According to this embodiment, the stackup 600 may include a non-conductive VSDM layer 210 protecting a plurality of regions of an electronic component 430. The VSDM layer 210 may generally be connected to ground via one or more conductors 220 arranged in the stackup 600, and by means of a pad 260, a via 270, or a combination thereof. The electronic component 430 being protected may be deposited, sputtered, or otherwise formed onto the VSDM layer 210. The electronic component 430 may be implemented as a thin film (e.g. resistive layer) and include at least one associated conductive lead 440. In the stackup 600, a first gap 650 and a second gap 652 define substantially separate regions of the VSDM layer 210 through which current may pass during an overvoltage event.

Figure 7:
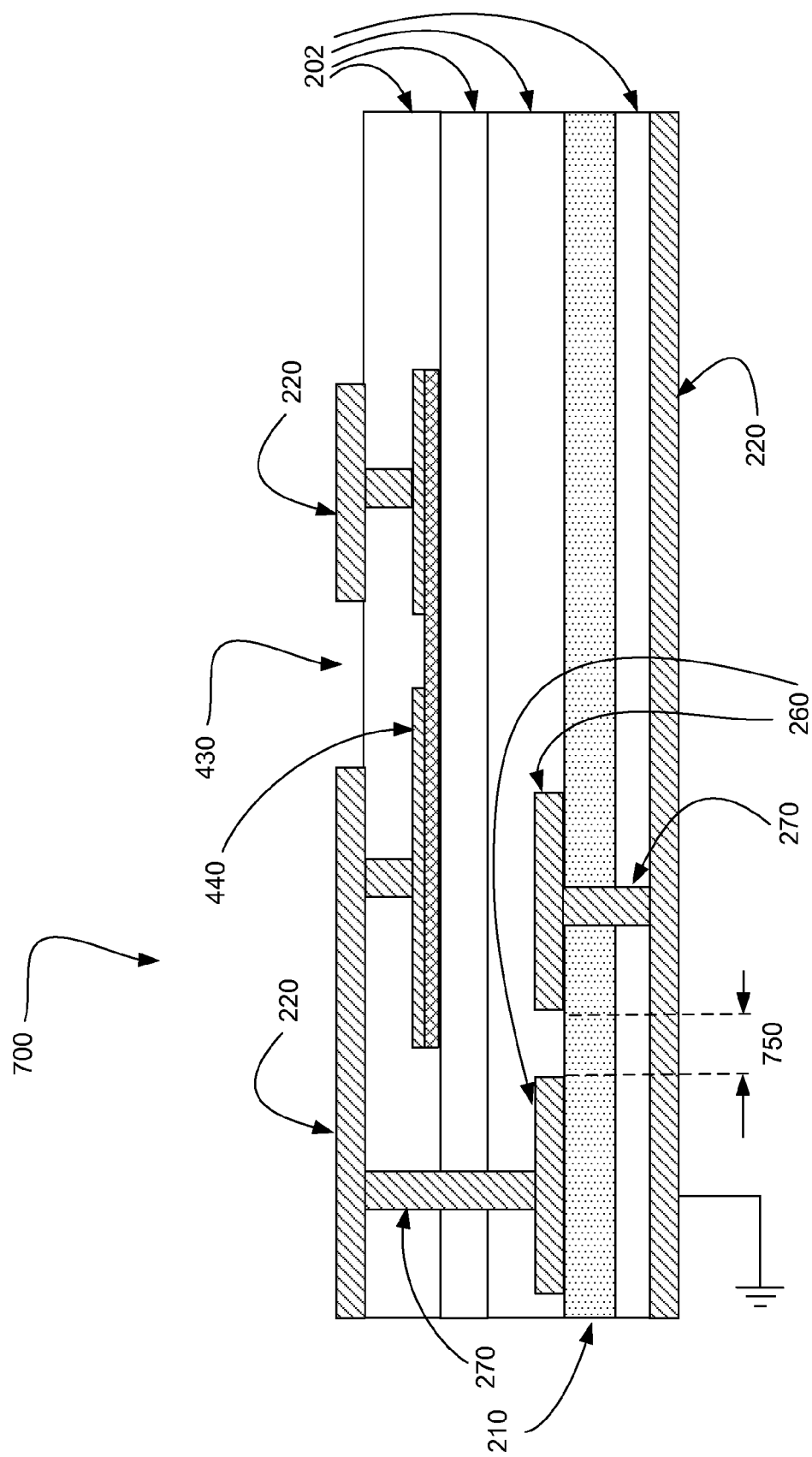

FIG. 7 illustrates a cross section of an exemplary stackup 700. In this embodiment, the stackup 700 may provide for a VSDM layer 210 with one or more non-conductive substrates 202 between the VSDM layer and the electronic component 430 being protected. The stackup 700 may also include one or more conductors 220, one or more vias 270, and one or more pads 260, each of which may be interconnected between each other and to ground.

The VSDM layer 210 may include a gap 750. During an overvoltage event involving the electronic component 430, excess current may be shunted to ground via the gap 750 of the VSDM layer 210, rather than passing through the component 430 itself, thereby protecting component 430 from damage or destruction.

Figure 8:
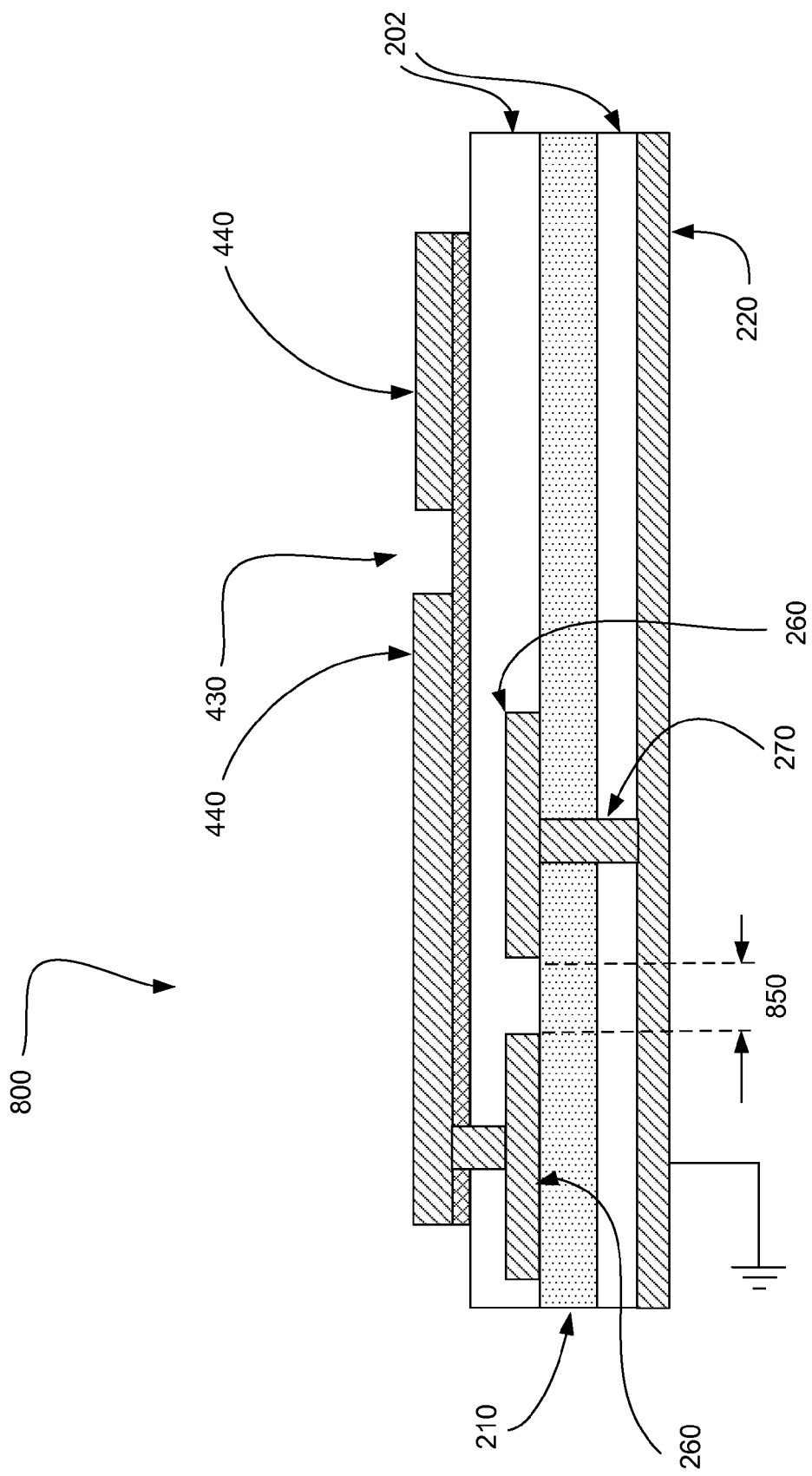

FIG. 8 illustrates a cross section of an exemplary stackup 800. As shown, the stackup 800 may include at least two non-conductive substrates 202, a VSDM layer 210 disposed between the substrates 202, an electronic component 430 including one or more conductive leads 440, and a plurality of connection elements, such as a conductor 220, a via 270, pads 260, or a combination thereof. The electronic component 430 may be arranged on a first substrate 202, and may not have a direct contact with the VSDM layer 210, but rather an electrical contact accomplished by the plurality of connection elements. The VSDM layer 210 may include a gap 850, which may be associated with an active region of current passage (e.g., between pads 260 on either side of the gap 850) during an overvoltage event.

Figure 9A:
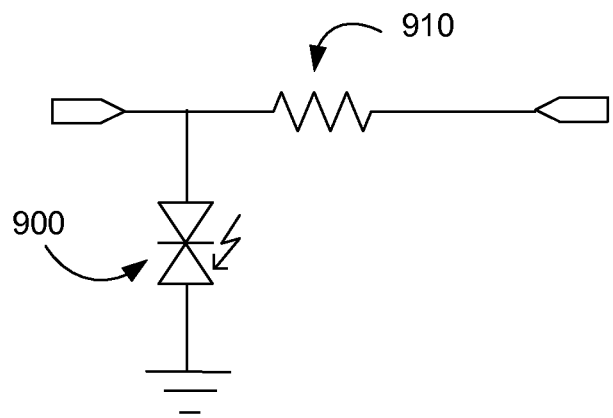
FIGS. 9A-C illustrate several circuits incorporating a VSDM element.
Figure 9B:
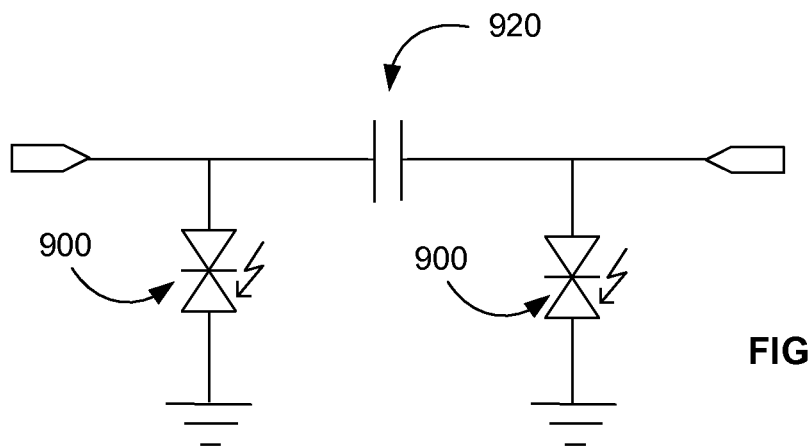
Figure 9C:
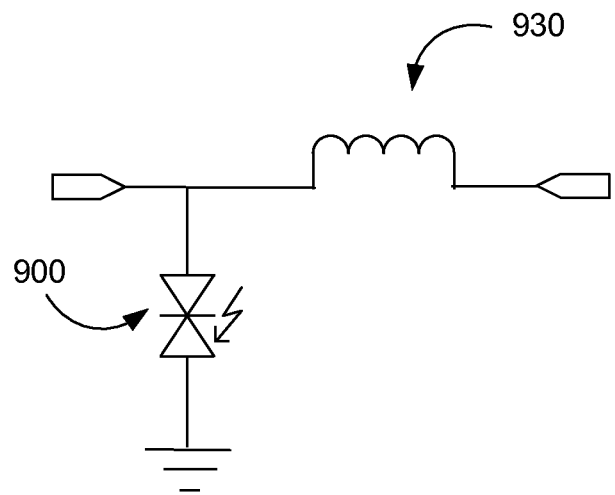

FIGS. 9A-C illustrate several circuit schemes incorporating a VSDM element. In these illustrations, a VSDM element 900 is shown schematically as an electrical valve with a lightning bolt symbol. In these examples, the VSDM element 900 is connected to a conductor that may be connected to ground, and is electrically (and sometimes physically) connected to an electronic device or electronic component to be protected.

FIG. 9A illustrates a VSDM 900 protecting a resistor 910, which may be a surface mounted or an embedded resistor. In this example, the VSDM 900 is electrically connected to a lead of the resistor 910. An overvoltage event, such as ESD or EOS capable of damaging the resistor 910, may result in shunting excess current to ground via the VSDM element 900.

FIG. 9B illustrates a VSDM element 900 protecting a capacitor 920, which may be a surface mounted or an embedded capacitor. In this example, the VSDM element 900 is connected to leads on both sides of the capacitor 920. An overvoltage event that might damage the capacitor 920 may result in shunting excess current to ground via at least one of the VSDM elements 900.

FIG. 9C illustrates a VSDM element 900 protecting an inductor 930, which may be an embedded inductor. In this example, the VSDM element 900 is connected to a lead of the inductor 930. In case of an overvoltage event that might damage inductor 930, excess current is shunted to ground via the VSDM element 900.

Some embodiments may include sensors to sense various parameters (e.g., current, voltage, power, resistance, resistivity, inductance, capacitance, thickness, strain, temperature, stress, concentration, depth, length, width, switching voltage and/or voltage density (between insulating and conducting), trigger voltage, clamp voltage, off-state current passage, dielectric constant, time, date, and other characteristics). Various apparatuses may monitor various sensors, and systems may be actuated by automated controls (solenoid, pneumatic, piezoelectric, and the like). Some embodiments may include a computer-readable storage medium coupled to a processor and memory. Executable instructions stored on the computer readable storage medium may be executed by the processor to perform, control or monitor various methods of operating and/or protecting electronic components arranged in PCBs. Sensors and actuators may be coupled to the processor, providing input and receiving instructions associated with various methods. Certain instructions may be provided for closed-loop control of various parameters via coupled sensors providing input and coupled actuators receiving instructions to adjust parameters. Various embodiments may include different electronic devices such as telephones (e.g., cell phones), Universal Serial Bus (USB)-devices (e.g., a USB-storage device), personal digital assistants (PDAs), laptop computers, netbook computers, tablet Personal Computer (PC), light emitting diodes (LEDs), and the like.

The foregoing description is provided to enable any person skilled in the art to make or use specific embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments described herein but is to be accorded the widest scope consistent with the principles disclosed herein.

What is claimed is:

1. A printed circuit board, comprising:
    at least one conductor;
    a voltage switchable dielectric material (VSDM) layer applied to the at least one conductor;
    an electronic component having at least one lead and disposed on the VSDM layer, wherein the at least one lead is electrically coupled to the VSDM layer;
    a via; and
    a conductive pad connected to the conductor by the via,
    wherein the VSDM layer comprises an active volume defined by a gap between the at least one lead and the conductive pad, wherein the active volume to pass current through to a ground during an overvoltage event.

2. The printed circuit board of claim 1, wherein the electronic component is a surface mounted component.

3. The printed circuit board of claim 2, wherein the surface mounted component includes one or more of a resistor, an inductor, and a capacitor.

4. The printed circuit board of claim 2, wherein the surface mounted component includes one or more of a diode, a transistor, a semiconductor device, a circuit, a chip, and an integrated circuit.

5. The printed circuit board of claim 1, wherein the VSDM layer is incorporated within a non-conductive layer.

6. The printed circuit board of claim 1, wherein the VSDM layer is disposed between at least two non-conductive layers.

7. The printed circuit board of claim 1, wherein the electronic component comprises a thin film resistive layer.

8. A printed circuit board, comprising:
    at least one non-conductive layer;
    at least one conductor;
    a voltage switchable dielectric material (VSDM) layer applied to one of the at least one non-conductive layer;
    an electronic component having at least one lead and is mounted to the VSDM layer, wherein the at least one lead is electrically coupled to the VSDM layer; and
    a via; and
    a conductive pad connected to the conductor by the via,
    wherein the VSDM layer comprises an active volume defined by a gap between the at least one lead and the conductive pad, wherein the active volume to pass current through to a ground during an overvoltage event.

9. The printed circuit board of claim 8, wherein the electronic component is a surface mounted component.

10. The printed circuit board of claim 9, wherein the surface mounted component includes one or more of a resistor, an inductor, and a capacitor.

11. The printed circuit board of claim 9, wherein the surface mounted component includes one or more of a diode, a transistor, a semiconductor device, a circuit, a chip, and an integrated circuit.

12. The printed circuit board of 8, wherein the VSDM layer is incorporated within the at least one non-conductive layer.

13. The printed circuit board of claim 8, wherein the VSDM layer is disposed between at least two non-conductive layers.

14. The printed circuit board of claim 8, wherein the electronic component comprises a thin film resistive layer.

* * * * *